(12) United States Patent
Cohen et al.

(10) Patent No.: US 6,642,805 B1
(45) Date of Patent: Nov. 4, 2003

(54) APPARATUS AND COMPENSATION METHOD FOR PORTS VARIATION

(75) Inventors: Avraham Cohen, Ra'anana (IL); Offer Schwartsglass, Jerusalem (IL)

(73) Assignee: Mindspeed Technologies, Newport Beach, CA (US)

( * ) Notice: Subject to any disclaimer, the term of this patent is extended or adjusted under 35 U.S.C. 154(b) by 0 days.

(21) Appl. No.: 09/987,826

(22) Filed: Nov. 16, 2001

Related U.S. Application Data

(60) Provisional application No. 60/249,603, filed on Nov. 17, 2000.

(51) Int. Cl.[7] ................................................ H03L 7/10
(52) U.S. Cl. .......................................... 331/179; 331/10
(58) Field of Search ............................. 331/179, 10, 11, 331/14, 15

(56) References Cited

U.S. PATENT DOCUMENTS

| | | | |
|---|---|---|---|
| 4,929,917 A | 5/1990 | Yokogawa et al. | 331/1 A |
| 5,552,727 A | 9/1996 | Nakao | 327/159 |
| 5,625,325 A | 4/1997 | Rotzoll et al. | 331/16 |
| 5,648,744 A | 7/1997 | Prakash et al. | 331/11 |

*Primary Examiner*—Robert Pascal
*Assistant Examiner*—Joseph Chang
(74) *Attorney, Agent, or Firm*—Weide & Miller, Ltd.

(57) ABSTRACT

A circuit for monitoring and controlling input to a VCO, comprises: (A) a monitoring sub-circuit for monitoring input; (B) a stepping sub-circuit for stepping the VCO's frequency range; (C) an input reduction sub-circuit for reducing input into the monitoring sub-circuit; and (D) a VCO.

10 Claims, 5 Drawing Sheets

APPARATUS AND COMPENSATION METHOD FOR PORTS VARIATION

CROSS REFERENCE TO RELATED APPLICATIONS

In accordance with 35 USC §120, the present application claims the priority of the filing date of U.S. Provisional Application S.No. 60/249,603, filed Nov. 17, 2000, the entire contents of which are incorporated herein in their entirety.

FIELD OF THE INVENTION

This invention relates to phase lock loops (PLLs). More specifically, this invention relates to monitoring and controlling the input voltages to the "voltage controlled oscillator" (VCO) for use in optimizing a PLL.

BACKGROUND OF THE INVENTION

A PLL (Phase Lock Loop) is a basic design in communication chips. The PLL's design goal is the generation of a clock with precise frequency and phase by control over a "VCO" block (Voltage Controlled Oscillator) that is part of the PLL.

The smaller the "VCO gain" (the ratio of additional voltage vs. additional frequency) is, the better is the precision of the control over the VCO and frequency. Additionally, reduced VCO gain improves resistance to noise as well, because a small range of frequency is relating to a wide range of voltage (i.e. a major change in the input voltage will produce only a minor adjustment in the frequency).

In order to utilize narrow bands of voltage level in the circuit (i.e. a reasonable range of 10 millivolts–1 volt), the design should be one wherein the launch value of the frequency fits the narrow range where the desired frequency is. Due to inherent inconsistencies in manufacturing procedures or raw material qualities, the initial frequency obtained may vary, thus the range of voltage cannot be as narrow as could ideally be wished for.

As the VCO gain is reduced, the variation over the input voltage gets larger in order to maintain the same frequency range. Large variation over the input voltage creates a large distortion of operation in the other control circuits in the PLL, and makes the design of those circuits more difficult.

Therefore there is a need in the art for PLL circuits in which the required voltage range can be narrowed without losing the flexibility of achieving a narrow VCO gain.

SUMMARY AND OBJECTS OF THE INVENTION

Therefore, it is an object of the present invention to provide a PLL with a compensation circuit which is less sensitive to input voltage changes.

It is a further object of the present invention to provide a PLL with a compensation circuit permitting one to obtain as small a VCO gain as desired, while maintaining the minimum voltage range needed.

It is a further objective of the compensation circuit of the present invention, to produce a resultant reduction in the number of communications chips which are produced that are unacceptable due to the disparity between the initial frequency and the desired frequency range.

Those objectives and others not mentioned hereinabove are achieved by the present invention in which a compensation circuit monitors the input voltage to the VCO. When the monitored voltage reaches a certain predetermined and/or selectable level (as large as one's control circuit is designed to tolerate) the circuit automatically steps the VCO (i.e. changes the range of the frequency) up by one step and lowers the voltage back to its base level. This procedure can be repeated until the desired frequency is achieved.

Using the exemplary embodiments described hereinbelow provides one skilled in the art to control VCOs over a very large frequency range, as much as 10%–15% of the tuning frequency/process, using a very small voltage range, from 10 millivolts to as much as 1 Volt. Particularly, in PLL circuits, the range of frequency may be from 10%–50% tuning frequency over process.

DETAILED DESCRIPTION OF EXEMPLARY EMBODIMENT

An exemplary embodiment of the present invention is shown for use in combination with a differential VCO.

A circuit for monitoring and controlling input to a VCO, generally comprises (a) a monitoring sub-circuit for monitoring input; (b) a stepping sub-circuit for stepping the VCO's frequency range; (c) an input reduction sub-circuit for reducing input into said monitoring sub-circuit; and (d) a VCO.

Figure 1:
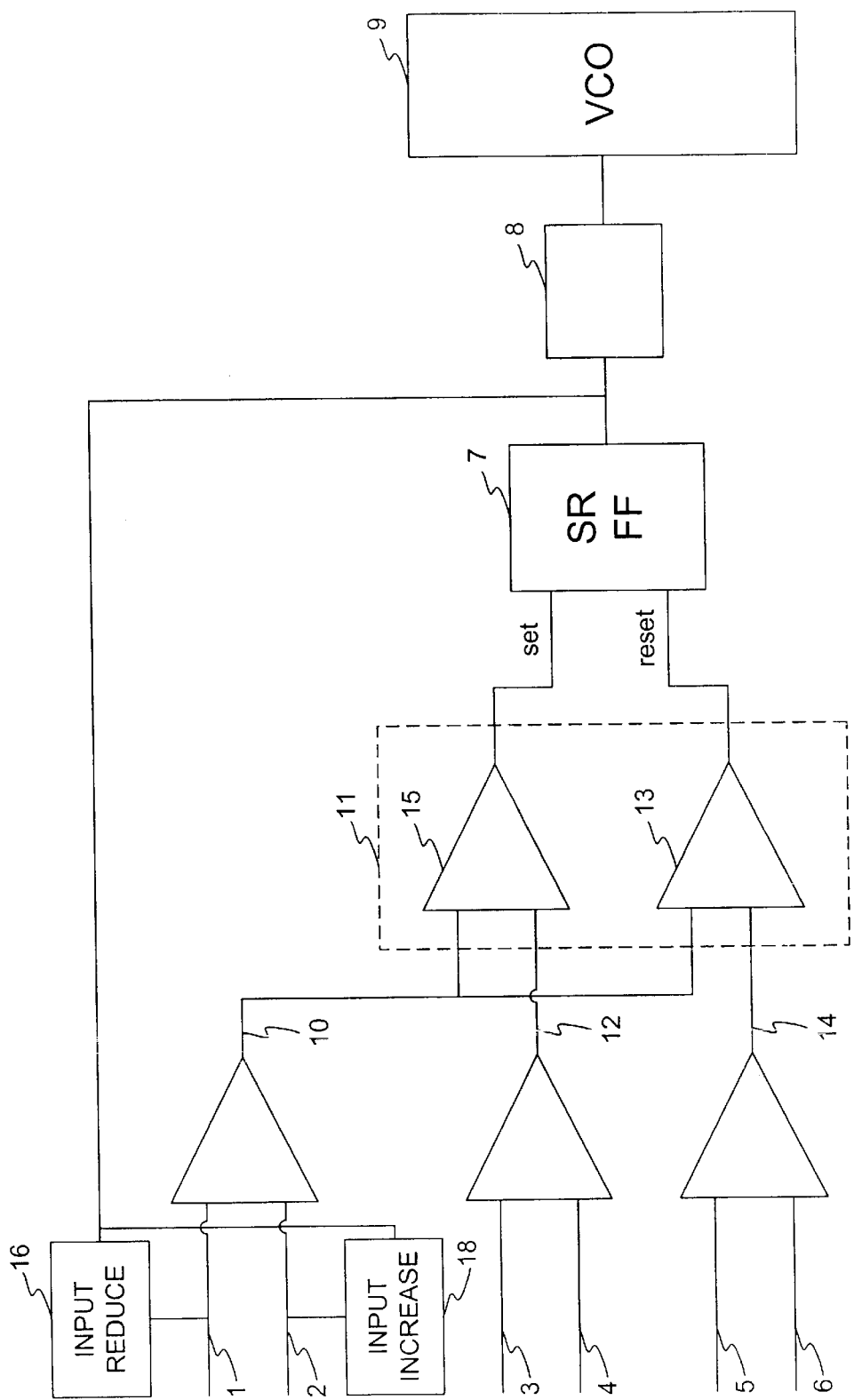
FIG. 1 shows a block diagram of an implementation for a circuit in accordance with the present invention.

Referring to FIG. 1, differential voltage 10 comprising input voltage 1 and input voltage 2 is compared to reference voltage 12 comprising input 3 and input 4. Comparator 11, comprised of differential amplifiers 13 and 15, compares differential voltage 10 and reference voltage 12, which are input to the amplifiers 13 and 15, and is responsible for setting set/reset flip-flop (SR-FF) 7 when the comparison is equal, i.e. differential voltage 10 has reached the upper limit specified by reference voltage 12.

When SR-FF 7 is set:
[1] Counter 8 is incremented,
[2] VCO 9 is calibrated, i.e. stepped up to the next range of frequency, and
[3] An equalization process of input voltage 1 and 2 is commenced.

Methods for calibration of VCOs are well known in the art, for example, where the VCO is real voltage-controlled the calibration circuit can add a small amount of voltage to the oscillator in order to adjust it to the right level. Yet another example is where the VCO is a voltage-to-current converter followed by a current-controlled oscillator. In that instance, it is known to use a circuit which adds a current adjustment to the oscillator.

The equalization process is done using discharge component 16 and charge component 18. Input reducing component 16 lowers input voltage 1 and input increasing component 18 increases input voltage 2. When comparator 11 determines that differential voltage 10 is equal to reference voltage 14 (i.e. differential voltage 10 has reached its lower limit as determined by reference voltage 14 comprising inputs 5 and 6), SR-FF 7 is reset and the equalization process stops. This whole process can be repeated several times until the desired frequency is achieved. This process allows the use of a circuit which needs to deal with a narrower band of possible voltage inputs. In an alternative exemplary embodiment shown in FIG. 3, where the voltage input is non-differential, i.e. there is only one input line, then only an input reducing component 16 is needed.

Figure 2:
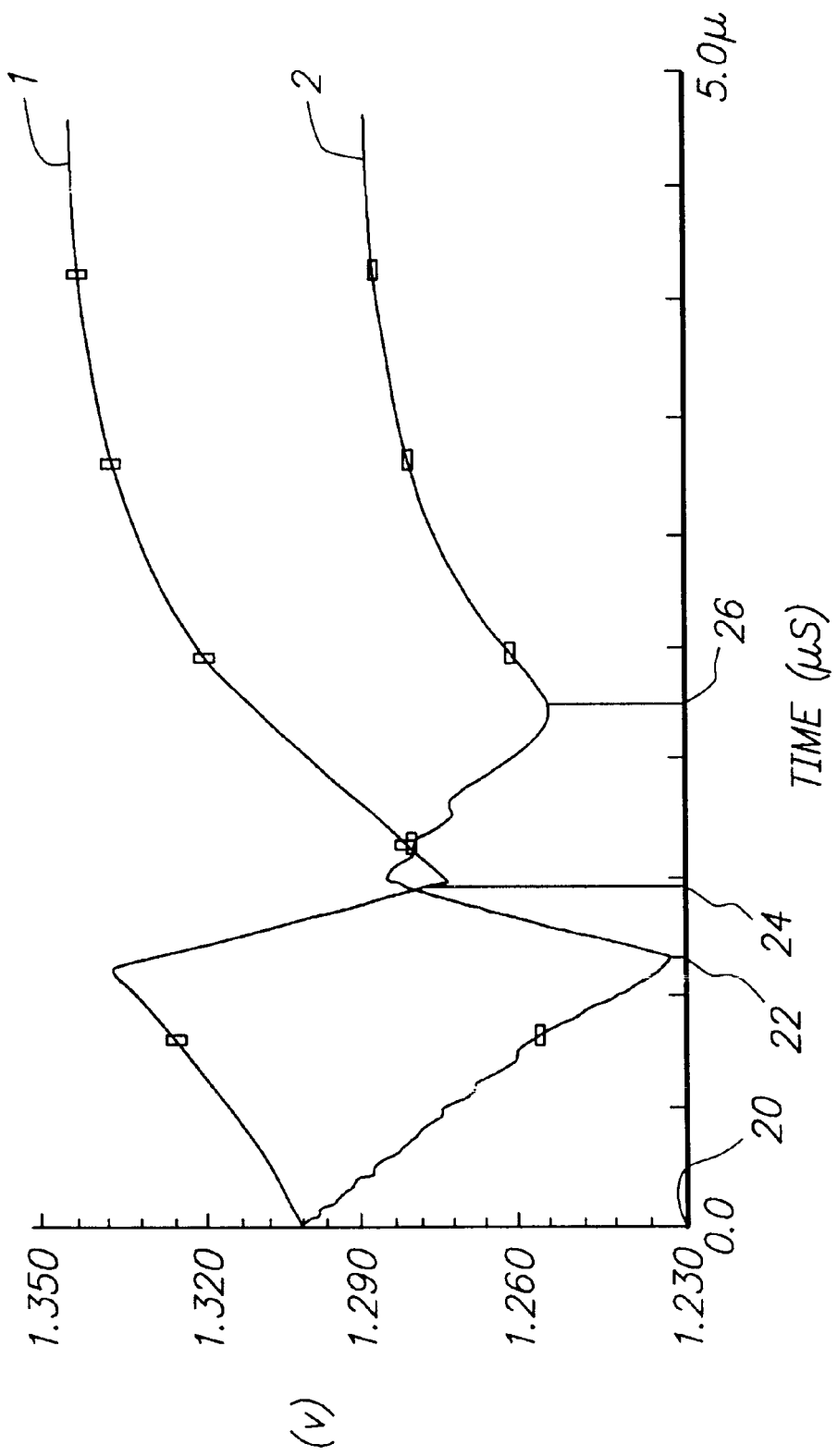
FIG. 2 shows a simulation of a "slow" corner and includes the input voltage and equalization signals behavior.

Referring to FIG. 2, the values of input voltages 1 and 2 are represented in a time graph. Starting point 20 on the time axis (the x-axis) indicates the beginning of the process where the differential voltage is at its lower limit. Input voltage 1 increases and input voltage 2 decreases until the differential voltage reaches its upper limit at triggering point 22, which initiates both calibration of the VCO 9 and the equalization process of input voltages 1 and 2, which proceeds until reset point 24. At which point, the differential voltage has been returned to its lower limit. At this stage the VCO 9 has a new range of frequency and the whole process is restarted. Lock point 26 indicates that the desired frequency has been achieved and the differential voltage has been locked on its value. This is an example where the equalization process occurs only once, however it should be understood that the process can be repeated many times depending on the value of the VCO gain and the initial frequency.

Figure 3:
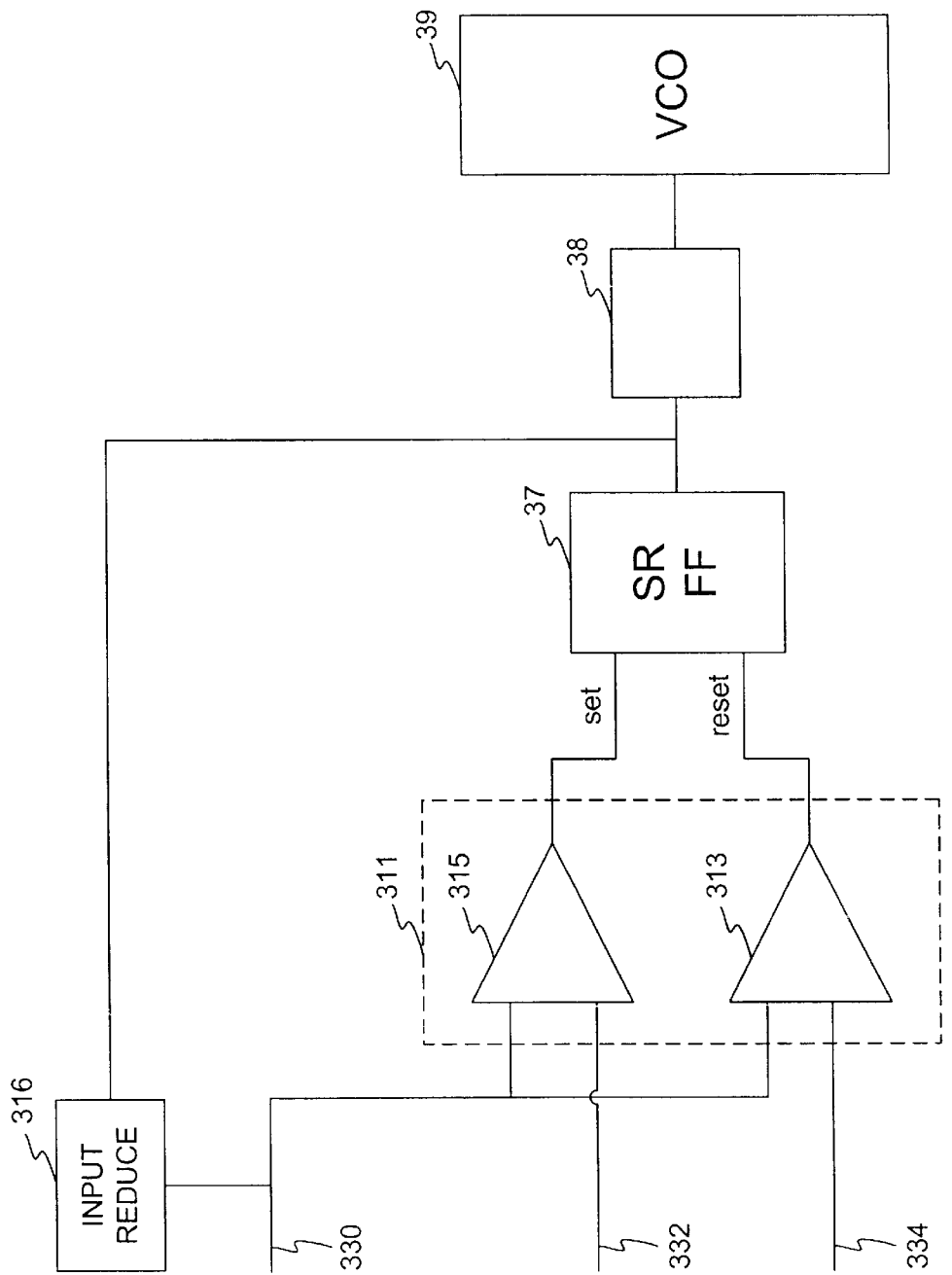
FIG. 3 shows a block diagram of an implementation for a circuit in accordance with an alternative exemplary embodiment of the present invention.

FIG. 3 shows, as an alternative exemplary embodiment of the present invention, a VCO which is controlled by single-end input voltage 330. Comparator 311, comprised of differential amplifiers 313 and 315, compares input voltage 330 and reference voltage 332, which are input to the amplifiers 313 and 315, and is responsible for setting set/reset flip-flop (SR-FF) 37 when the comparison is equal, i.e. input voltage 330 has reached the upper limit specified by reference voltage 332.

When SR-FF 37 is set:
[1] Counter 38 is incremented,
[2] VCO 39 is calibrated, i.e. stepped up to the next range of frequency, and
[3] A reduction process of input voltage 330 is commenced.

The reduction process is done using input reduction component 316 to lower input voltage 330. When comparator 311 determines that differential voltage 310 is equal to reference voltage 334 (i.e. input voltage 330 has reached its lower limit as determined by reference voltage 334), SR-FF 37 is reset and the reduction process stops.

Figure 4:
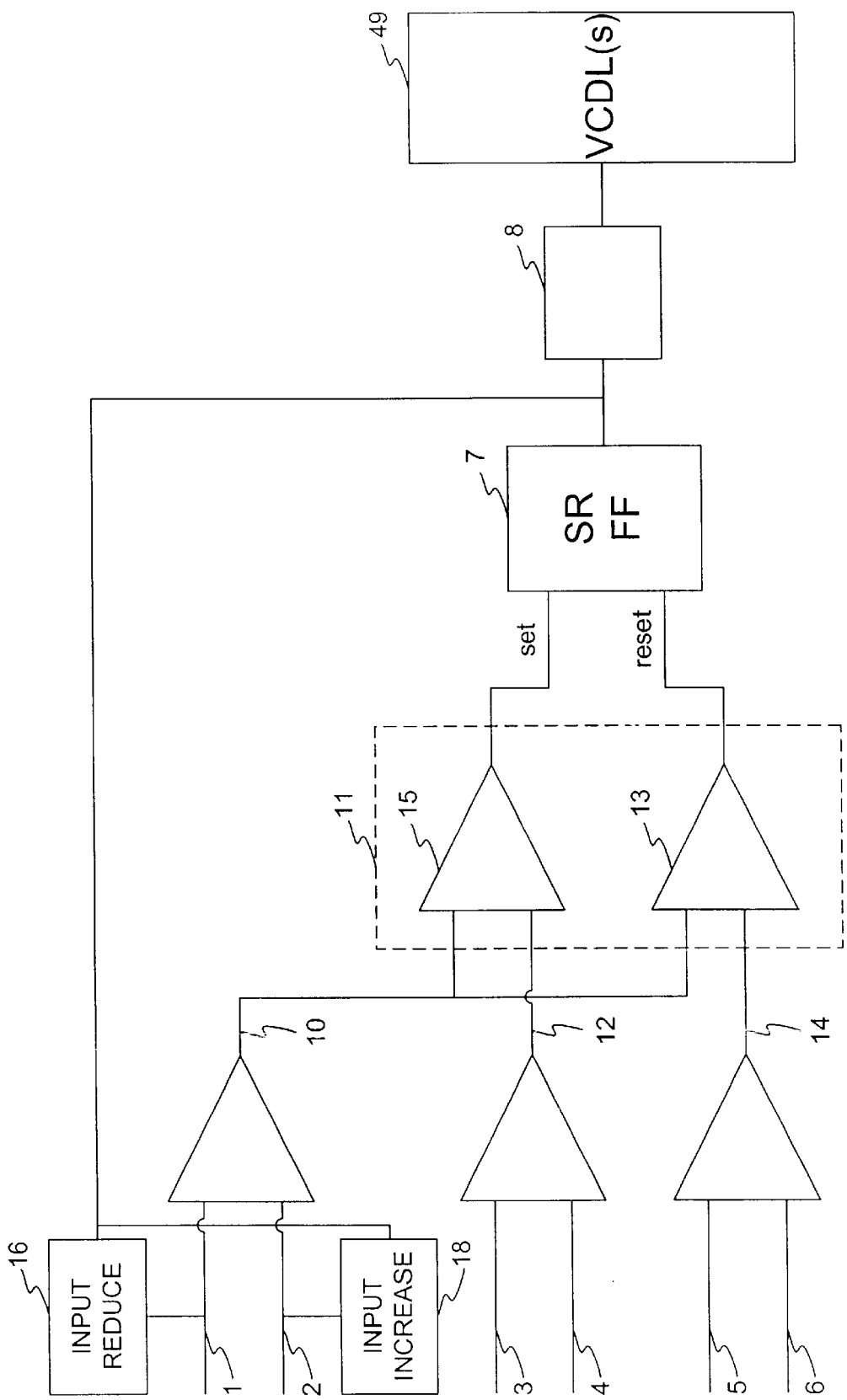
FIG. 4 shows a block diagram of an implementation for use with a voltage controlled delay line.
Figure 5:
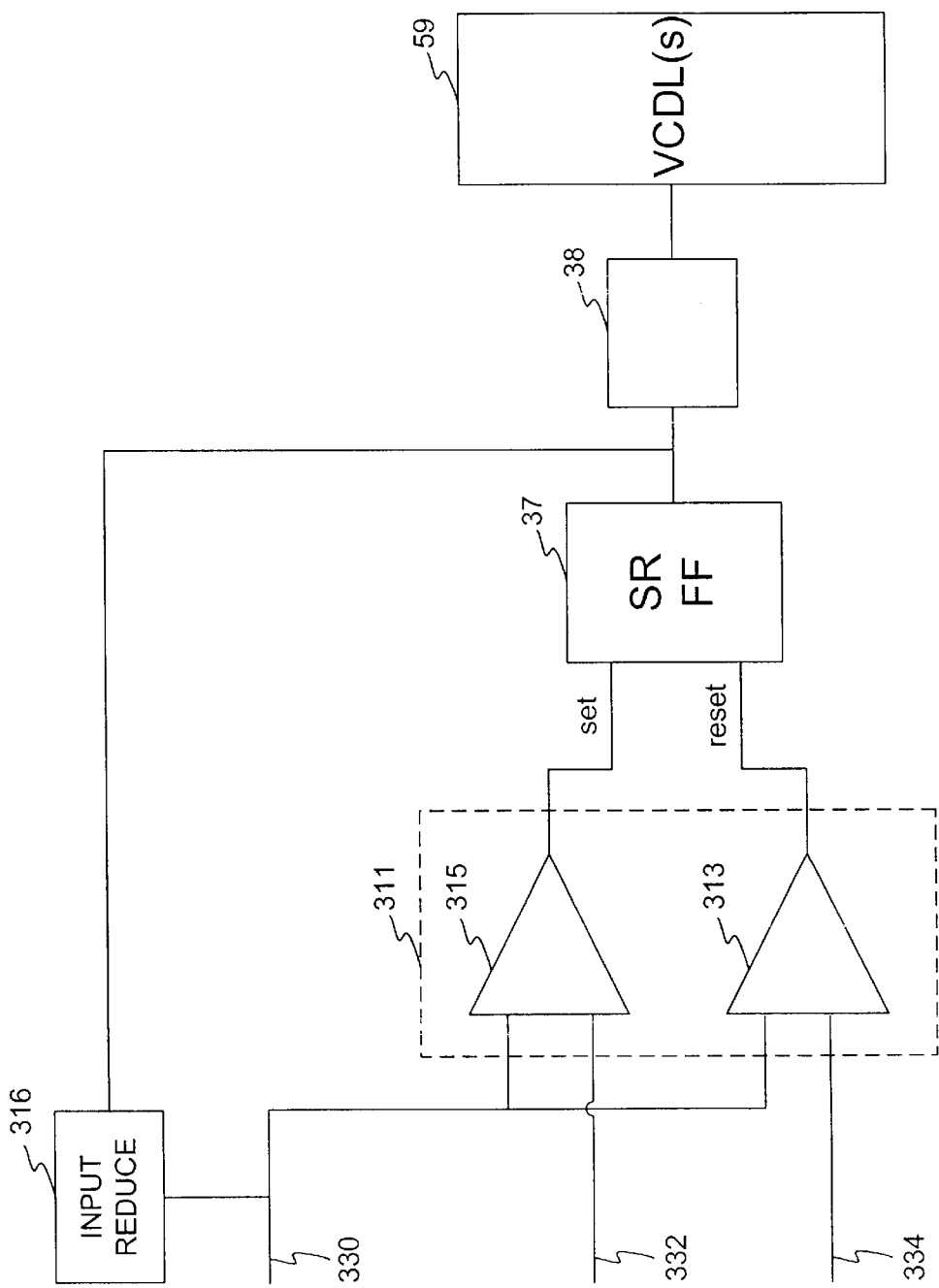
FIG. 5 shows a block diagram of an implementation for a circuit in accordance with an alternative example embodiment having a voltage controlled delay line.

While the exemplary embodiments hereinabove describe one exemplary use of the inventive circuit for controlling voltage input to and calibration of a VCO, it should be understood that the disclosed circuit can be easily adapted to be used with VCDLs (Voltage Controlled Delay Lines), as well as other input level sensitive components where calibration is also sought as a second necessary function. FIG. 4 shows an example embodiment of the circuit of FIG. 1 configured with a voltage controlled delay line 49. FIG. 5 shows an example embodiment of the circuit of FIG. 3 configured with a voltage controlled delay line 59. It should be understood that selectively reactable component combinations other than a set/reset FF together with a counter may be used as the detector/trigger combination for signaling the needed input reduction and calibration functions of the inventive circuit.

The disclosed compensation circuit has great advantages when incorporated into a chip that includes several ports (each with its own VCO) and in which each of them requires a different amount of voltage to generate the same frequency. In that situation, the compensation process controls the input voltage to each of the VCOs and can individually adjust those inputs to the appropriate value in order to achieve a common frequency. Also, when a circuit is very sensitive to noise and variable oscillation over the VCO, thus requiring that the VCO must be very fine-tuned, this compensation circuit is particularly robust because the VCO gain can be as small as the current technology allows and, as aforementioned, the control over the frequency and the resistance to noise improved as the VCO gain is made smaller.

One important advantage of this compensation circuit is the resultant increase in the yield of chips, since, without this circuit many chips produced according to prior art methods would have been deemed unacceptable due to the disparity between the initial frequency and the desired frequency range.

Another advantage of the this compensation circuit is the use of the circuit as a detector of the condition of the VCO gain itself (i.e. its behavior due to changes in the input voltage). The circuit could be combined with known VCO gain calibration circuits (for example, the circuit disclosed in U.S. Pat. No. 5,625,325 to Rotzoll et al.) as a controller, in order to provide a VCO gain adjuster. The method for analyzing the needed calibration of the VCO gain is done by counting the number of input reduction steps that have taken place in the circuits disclosed herein (i.e. the number of cycles that the process has done).

The foregoing description of an exemplary embodiment is presented in order to enable a person of ordinary skill in the art to design, make and utilize the present invention. Various modifications and adaptations to the exemplary embodiment will be apparent to those skilled in the art, and different modifications may be applied to different embodiments. Therefore, it will be appreciated that the invention is not limited to what has been described hereinbelow merely by way of example. Rather, the invention is limited solely by the claims which follow this description.

We claim:

1. A circuit for monitoring and controlling input to a VCO, comprising:
   (A) a monitoring sub-circuit for monitoring input;
   (B) a stepping sub-circuit for stepping the VCO's frequency range;
   (C) an input reduction sub-circuit for reducing input into said monitoring sub-circuit; and
   (D) a VCO, wherein said input reduction sub-circuit comprises a voltage reducing element.

2. A circuit for monitoring and controlling input to a VCDL comprising:
   (A) a monitoring sub-circuit for monitoring input;
   (B) a stepping sub-circuit for stepping the VCDL's frequency range;
   (C) an input reduction sub-circuit for reducing input into said monitoring sub-circuit; and
   (D) a VCDL, wherein said input reduction sub-circuit comprises a voltage reducing element.

3. A method for monitoring and controlling VCO's input comprising the following steps: monitoring the level of a voltage input; activating a trigger when the voltage input is equal to a reference voltage; triggering a VCO calibration circuit and reducing the input voltage to a lower limit.

4. A method for monitoring and controlling a VCO's input according to claim 3, further comprising the step of terminating input voltage reduction when the input voltage is equal to a lower limit.

5. A method for monitoring and controlling a VCO's input according to claim 4, further comprising equalizing the input voltage where the input voltage is a differential voltage of two inputs.

6. A method for adjusting a VCO gain comprising monitoring and controlling a VCO's input by the steps of monitoring the level of a voltage input; activating a trigger when the voltage input is equal to a reference voltage; triggering a VCO calibration circuit and reducing the input voltage to a lower limit; resetting the input voltage reducer when the input voltage is equal to a "lower limit" reference voltage and calibrating the VCO gain.

7. A method for monitoring and controlling a VCDL's input comprising the following steps: monitoring the level of a voltage input; activating a trigger when the voltage input is equal to a reference voltage; triggering a VCDL calibration circuit and reducing the input voltage to a lower limit.

8. A method for monitoring and controlling a VCDL's input according to claim 7, further comprising the step of terminating input voltage reduction when the input voltage is equal to a lower limit.

9. A method for monitoring and controlling a VCDL's input according to claim 8, further comprising equalizing the input voltage where the input voltage is a differential voltage of two inputs.

10. A method for adjusting a VCDL gain comprising monitoring and controlling a VCDL's input by the steps of monitoring the level of a voltage input; activating a trigger when the voltage input is equal to a reference voltage; triggering a VCDL calibration circuit and reducing the input voltage to a lower limit; resetting the input voltage reducer when the input voltage is equal to a "lower limit" reference voltage and calibrating the VCDL gain.

* * * * *